(12) United States Patent
Kudo

(10) Patent No.: US 7,786,478 B2
(45) Date of Patent: Aug. 31, 2010

(54) SEMICONDUCTOR INTEGRATED CIRCUIT HAVING TERMINAL FOR MEASURING BUMP CONNECTION RESISTANCE AND SEMICONDUCTOR DEVICE PROVIDED WITH THE SAME

(75) Inventor: Akiji Kudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/488,707

(22) Filed: Jun. 22, 2009

(65) Prior Publication Data

US 2009/0315029 A1 Dec. 24, 2009

(30) Foreign Application Priority Data

Jun. 23, 2008 (JP) ............................. 2008-163693

(51) Int. Cl.
*H01L 23/58* (2006.01)

(52) U.S. Cl. ................................. 257/48; 257/E23.01

(58) Field of Classification Search .................... 257/48, 257/737, 778, 786, 797, E23.01
See application file for complete search history.

(56) References Cited

U.S. PATENT DOCUMENTS

2009/0315029 A1* 12/2009 Kudo ........................... 257/48

FOREIGN PATENT DOCUMENTS

JP 2004-258131 9/2004

* cited by examiner

*Primary Examiner*—Mark Prenty
(74) *Attorney, Agent, or Firm*—Turocy & Watson, LLP

(57) ABSTRACT

An integrated circuit is formed in a chip. Positioning marks are provided on at least two of four regions respectively near four corners of a first main surface of the chip. Terminals are provided on the first main surface to measure bump connection resistance. The terminals adjoin the positioning marks respectively. A connection wire is provided in the chip. The connection wire is connected to the terminals electrically.

18 Claims, 12 Drawing Sheets

US 7,786,478 B2

SEMICONDUCTOR INTEGRATED CIRCUIT HAVING TERMINAL FOR MEASURING BUMP CONNECTION RESISTANCE AND SEMICONDUCTOR DEVICE PROVIDED WITH THE SAME

CROSS REFERENCE TO RELATED APPLICATION

This application is based upon and claims the benefit of priority from the prior Japanese Patent Application No. 2008-163693, filed on Jun. 23, 2008, the entire contents of which are incorporated herein by reference.

FIELD OF THE INVENTION

The invention relates to a semiconductor integrated circuit having a terminal to measure bump connection resistance and to a semiconductor device which is provided with the semiconductor integrated circuit.

DESCRIPTION OF THE BACKGROUND

The mounting technology of a semiconductor chip such as a chip on glass (hereinafter referred to as "COG"), a chip on film (hereinafter referred to as "COF"), and a chip on chip (hereinafter referred to as "COC") uses a gold (Au) bump or a solder bump. In the mounting using a COG or a COF, a plurality of lead terminals formed on a substrate and a plurality of chip terminals formed on a semiconductor integrated circuit are connected via bumps respectively. A plurality of positioning marks is provided on such a semiconductor integrated circuit generally in order to mount the semiconductor integrated circuit exactly on a predetermined position of a substrate. Japanese Patent Application Publication (Kokai) No. 2004-258131 discloses a liquid crystal display device, as a semiconductor device using a COG.

A plurality of terminals to measure bump connection resistance is provided on a drive IC chip shown in the patent publication. The terminals are used to decide whether bump connection resistances between lead terminals formed on a substrate and chip terminals formed on the drive IC chip is lower than a predetermined value or not.

External terminals, which are connected to the terminals to measure bump connection resistance, are provided on a liquid crystal panel side. It becomes difficult to ensure a space to arrange a plurality of measurement terminals to measure the bump connection resistance on a semiconductor chip such as a drive IC chip, with recent progress of reduction and high performance of the semiconductor chip.

SUMMARY OF THE INVENTION

An aspect of the present invention provides a semiconductor integrated circuit including a chip in which an integrated circuit is formed, positioning marks provided on at least two of four regions respectively near four corners of a first main surface of the chip, terminals to measure bump connection resistance, the terminals being provided on the first main surface so as to adjoin the positioning marks respectively, and a connection wire provided in the chip, the connection wire connecting the terminals electrically.

Another aspect of the present invention provides a semiconductor device comprising a substrate, at least two wiring patterns formed apart from each other on a first main surface on the substrate, a chip in which an integrated circuit is formed, positioning marks provided on at least two of four regions respectively near four corners of a first main surface of the chip, terminals to measure bump connection resistance, the terminals being provided on the first main surface so as to adjoin the positioning marks respectively, a connection wire provided in the chip, the connection wire connecting the terminals commonly, and bumps provided between the terminals and the wiring patterns to connect the terminals and the wiring patterns respectively electrically.

DETAILED DESCRIPTION OF THE INVENTION

Hereinafter, embodiments of the invention will be described with reference to the drawings. In FIGS. 1 to 12, the same numerals indicate the same portions respectively.

A first embodiment of the invention will be described with reference to FIGS. 1 to 4.

Figure 1:
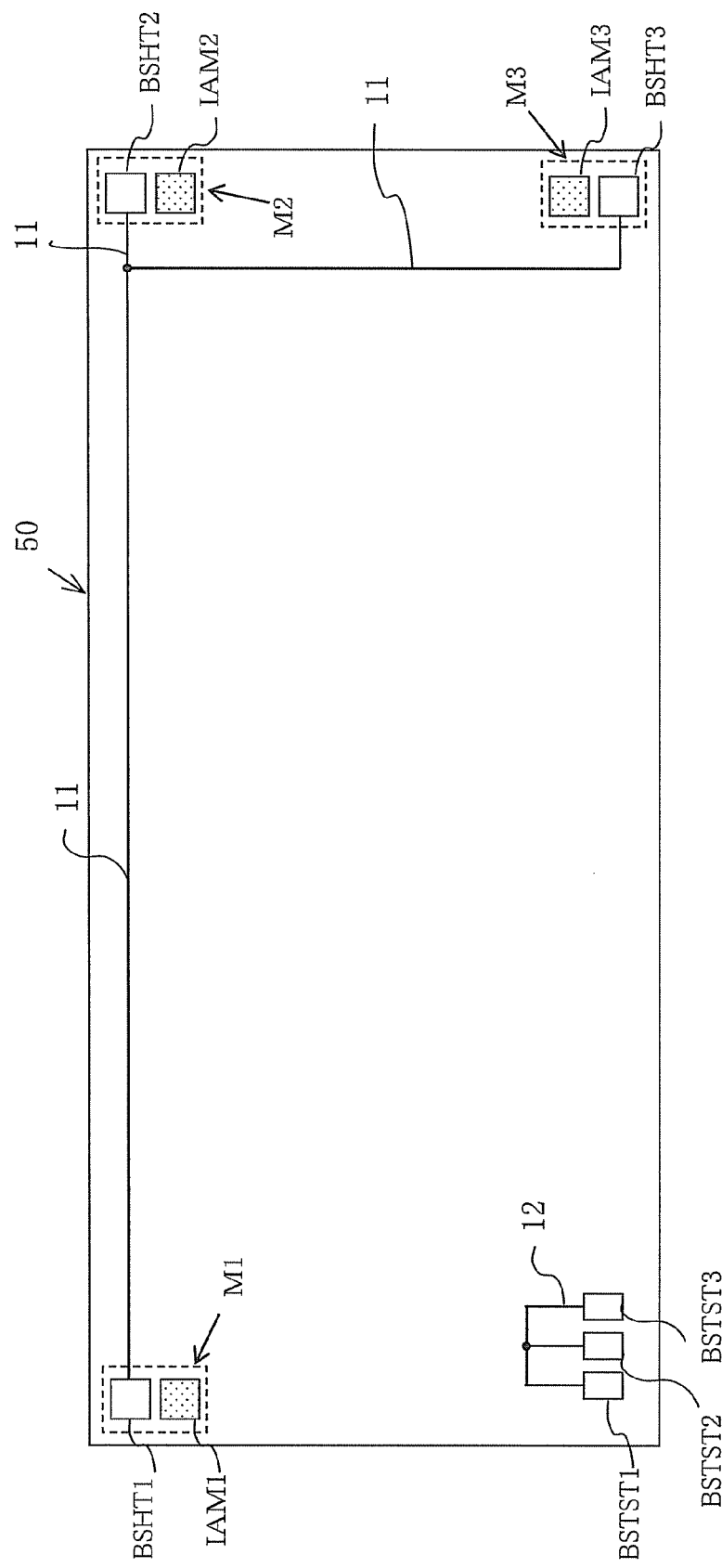
FIG. 1 is a plan view showing a liquid crystal drive device of a first embodiment of the invention.

FIG. 1 is a plan view showing a liquid crystal drive device 50 of the first embodiment. As shown in FIG. 1, the liquid crystal drive device 50 is composed of a chip which is constituted by a semiconductor substrate. The chip includes a data line drive circuit which is a semiconductor integrated circuit.

The liquid crystal drive device 50 is provided with terminals BSHT1 to BSHT3 and BSTST1 to BSTST3 to measure bump connection resistance which are arranged in positioning mark regions M1 to M3, positioning marks IAM1 to IAM3, and connection wires 11, 12. The terminals BSHT1 to BSHT3 are those used to evaluate the bump connection.

The liquid crystal drive device 50 transmits data corresponding to M channels to a liquid crystal display panel of M×N channels, for example, via chip terminals (not drawn) of the chip.

"M" and "N" indicate optional positive integers. The shape of the chip is a rectangular, the size of which in a X direction (the horizontal direction in FIG. 1) is longer than the size in a Y direction (the vertical direction in FIG. 1).

The chip terminals are formed at intervals on the chip composing the liquid crystal drive device 50. A plurality of bumps, which will be described in detail later, is laminated respectively on the chip terminals. The terminals BSHT1 to BSHT3 and BSTST1 to BSTST3 are ones of the chip terminals respectively.

The terminal BSHT1 is positioned at an upper left region of the chip in FIG. 1. The terminal BSHT2 is positioned at an upper right end region of the chip. The terminal BSHT3 is positioned at a lower right end region of the chip. The terminal BSTST1 is positioned at a lower left end region of the chip.

The bumps are respectively formed on the terminals BSHT1 to BSHT3 and BSTST1 to BSTST3 to measure bump connection resistance.

In FIG. 1, the chip terminals between the terminals BSHT1 and BSHT2, for example, are not shown.

The positioning marks IAM1 to IAM3 are formed of the same metal layer as that of the wire of the chip.

Figure 4:
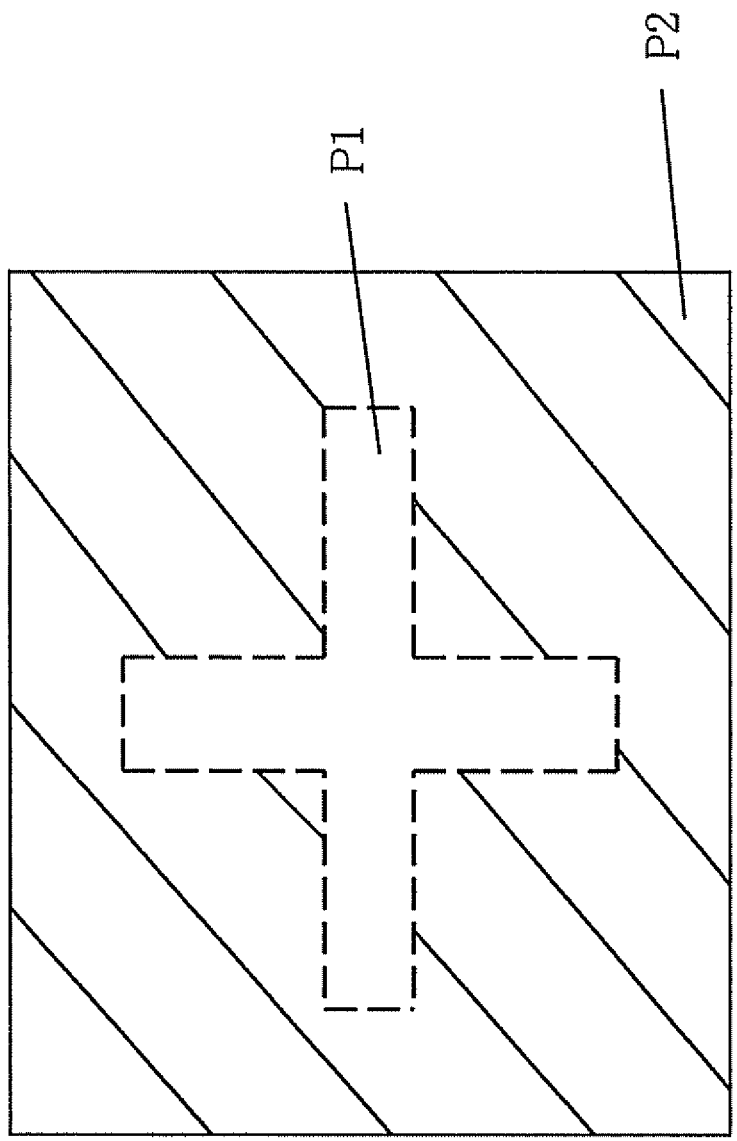
FIG. 4 is a plan view showing a shape of a positioning mark provided in the liquid crystal drive device shown in FIG. 1.

The terminals BSHT1 to BSTST3 and positioning marks IAM1 to IAM3, as shown in FIG. 4 have a shape of square having a cross void pattern at a central portion, for example, respectively.

In FIG. 4, a region P1 is void, and accordingly, a metal layer is not formed in the region P1. A region P2, which is present around the region P1, is formed of a metal layer. The terminals BSHT1 to BSTST3 and positioning marks IAM1 to IAM3 may have a shape of rectangular which has a cross remaining pattern instead of a cross void pattern.

The positioning mark region M1 is provided near an upper left corner of the liquid crystal drive device 50. In the positioning mark region M1, the terminal BSHT1 and positioning mark IAM1 are provided. The terminal BSHT1, on which one of the bumps is laminated, serves as a positioning mark and a terminal to measure bump connection resistance.

A lower portion of the terminal BSHT1, which is positioned in a direction vertical to the plane of the paper of FIG. 1, is connected to the connection wire 11 arranged directly under the terminal BSHT1 through a via. The connection wire 11 is provided in the chip of the liquid crystal drive device 50. The positioning mark IAM1 is arranged away from the terminal BSHT1 to measure bump connection resistance.

The positioning mark region M2 is provided near an upper right corner of the liquid crystal drive device 50. In the positioning mark region M2, the terminal BSHT2 and positioning mark IAM2 are provided. The terminal BSHT2, on which another one of the bumps is laminated, serves as a positioning mark and a terminal to measure bump connection resistance.

A lower portion of the terminal BSHT2, which is positioned in a direction vertical to the plane of the paper of FIG. 1, is connected to the connection wire 11 directly under the terminal BSHT2 through a via. The positioning mark IAM2 is arranged away from the terminal BSHT2 to measure bump connection resistance.

The positioning mark region M3 is provided near a lower right corner of the liquid crystal drive device 50. In the positioning mark region M3, the terminal BSHT3 and positioning mark IAM3 are provided.

Further another one of the bumps is laminated on the terminal BSHT3. The terminal BSHT3 serves as a positioning mark and as a terminal to measure bump connection resistance. A lower portion of the terminal BSHT3, which is positioned in a direction vertical to the plane of the paper of FIG. 1, is connected to the connection wire 11 provided under the terminal BSHT3 through a via. The positioning mark IAM3 is arranged away from the terminal BSHT3 to measure bump connection resistance.

The positioning marks IAM1 to IAM3 are used as positioning marks, when the bumps are formed in manufacture of the liquid crystal derive device 50. The terminals BSHT1 to BSHT3 are used as a positioning mark to position, when the liquid crystal drive device 50 is mounted on the glass substrate, which will be described in detail later.

Near a lower left corner of the liquid crystal drive device 50, the terminals BSTST1 to BSTST3 are provided. The terminals BSTST1 to BSTST3 are connected to the connection wires 12 which are mutually short-circuited.

The connection wires 12 are wires of the data wire drive circuit in the chip. On the terminals BSTST1 to BSTST3, metal bumps, which will be described in detail later, are provided.

The terminal BSTST2 is arranged near the terminal BSTST1. The terminal BSTST3 is arranged near the terminal BSTST2.

The connection wire 11, connection wire 12 or other wire layers of the liquid crystal drive device 50 may be composed of aluminum (Al). Copper (Cu) may be used instead of aluminum. Gold (Au) may be used for the bumps. Solder may be used for the bumps.

The terminals BSHT1 to BSHT3 and BSTST1 to BSTST3 are used as terminals to evaluate the bump connection resistance after the liquid crystal drive device 50 is mounted on the glass substrate.

Figure 3:
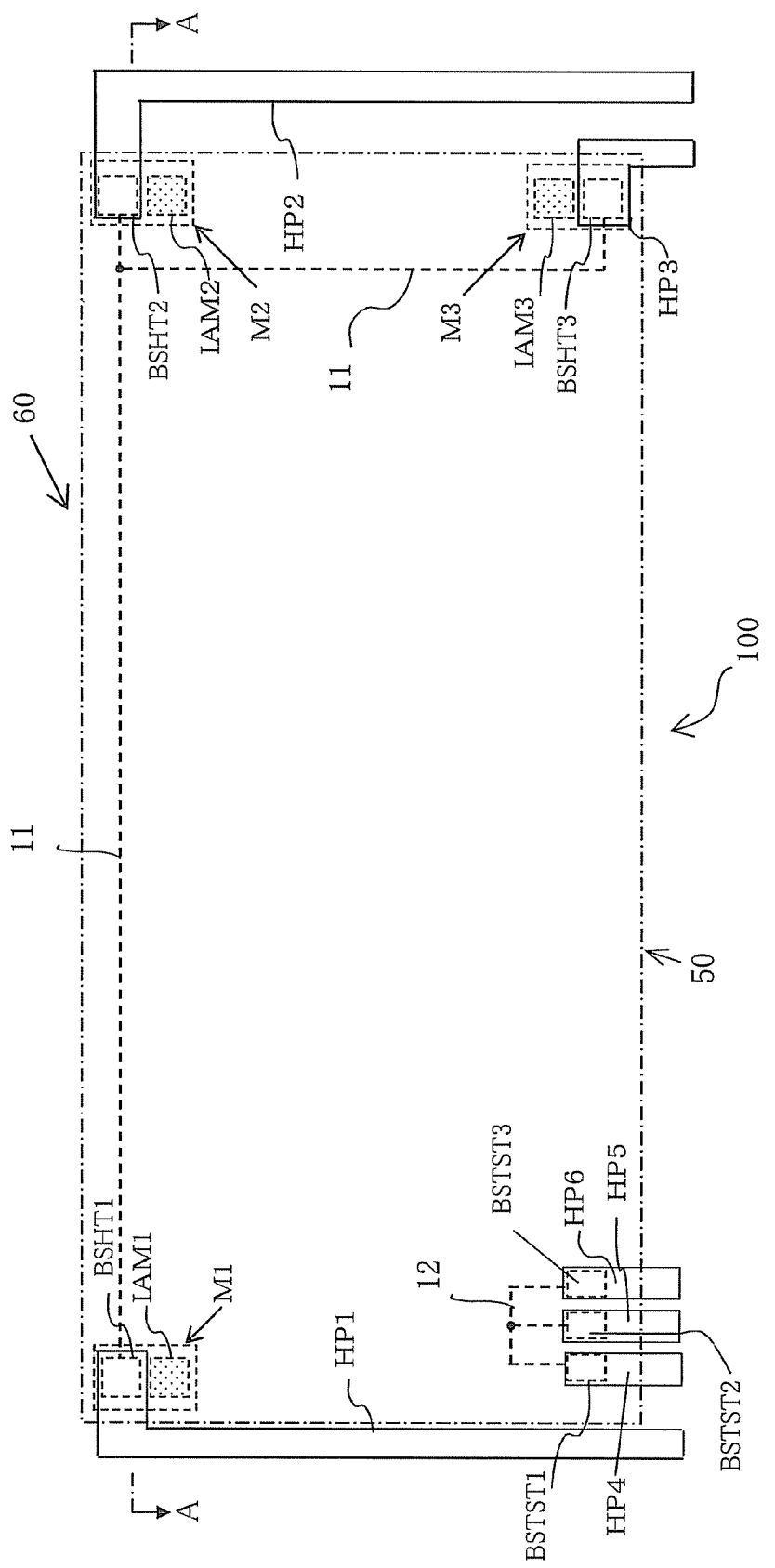
FIG. 3 is a plan view showing a semiconductor device where the liquid crystal drive device shown in FIG. 1 is mounted on a glass substrate.

FIG. 3 is a plan view showing a semiconductor device 100 where the liquid crystal drive device 50 shown in FIG. 1 is mounted on a glass substrate 60. The liquid crystal drive device 50 is mounted on the glass substrate 60 using an anisotropic conductive film (ACF) by a chip on glass method.

As shown in FIG. 3, wiring patterns HP1 to HP6 are provided on a first main surface of the glass substrate 60 to mount the liquid crystal drive device 50. The wiring patterns HP1 to HP6 are arranged away from each other. In FIG. 3, the glass substrate 60 is positioned upward in the direction vertical to the paper of the drawing. The wiring patterns HP1 to HP6 positioned downward in the vertical direction are indicated in solid lines. The liquid crystal drive device 50 is face-downed and mounted on the glass substrate.

The wiring pattern HP1 is extended from the upper left end region of the liquid crystal drive device 50 to the outside of the liquid crystal drive device 50. The wiring pattern HP1 overlaps with the terminal BSHT1 of the liquid crystal drive device 50.

The wiring pattern HP2 is extended from the upper right end region of the liquid crystal drive device 50 to the outside of the liquid crystal drive device 50. The wiring pattern HP2 overlaps with the terminal BSHT2 of the liquid crystal drive device 50. The wiring pattern HP3 is extended from the lower right end region of the liquid crystal drive device 50 to the outside of the liquid crystal drive device 50. The wiring pattern HP3 overlaps with the terminal BSHT3 of the liquid crystal drive device 50.

The wiring pattern HP4 overlaps with the terminal BSTST1 of the liquid crystal drive device 50. The wiring pattern HP4 is extended from the lower left end region of the liquid crystal drive device 50 to the outside of the liquid crystal drive device 50.

The wiring pattern HP5 overlaps with the terminal BSTST2 of the liquid crystal drive device 50. The wiring pattern HP5 is extended from the lower left end region of the liquid crystal drive device 50 to the outside of the liquid crystal drive device 50.

The wiring pattern HP6 overlaps with the terminal BSTST3 of the liquid crystal drive device 50. The wiring pattern HP6 is extended from the lower left end region of the liquid crystal drive device 50 to the outside of the liquid crystal drive device 50.

Figure 5:
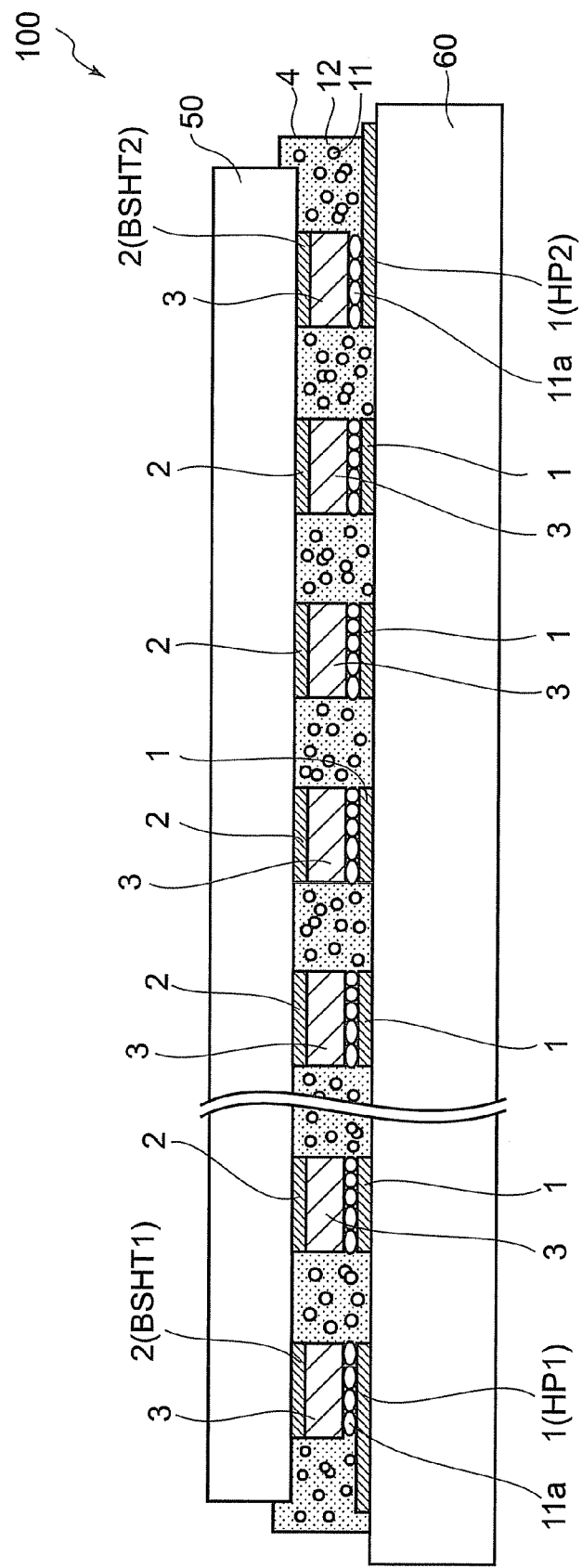
FIG. 5 is an enlarged view of a section of the semiconductor device shown in FIG. 3.

FIG. 5 is an enlarged view of a section which is taken along a plane A-A of the semiconductor device shown in FIG. 3.

The liquid crystal drive device 50, which is face-downed so as to face the first main surface of the glass substrate 60, is mounted on the first main surface of the glass substrate 60.

A plurality of lead terminals 1, ..., 1 is provided on the first main surface of the glass substrate 60. Some of the lead terminals 1, ..., 1 are the wiring patterns HP1 to HP6 shown in FIG. 3. The chip terminals 2, ..., 2 mentioned previously are formed on the first main surface of the liquid crystal drive device 50. The metal bumps 3 mentioned above are laminated on the chip terminals 2, ..., 2 respectively. Some of the chip terminals 2, ..., 2 are the terminals BSHT1 to BSTST3 to measure bump connection resistance.

An anisotropic conductive film 4 is provided between the glass substrate 60 and the liquid crystal drive device 50. The anisotropic conductive film 4 is a film having an adhesive 12 in which conductive particles 11, ..., 11 with an almost uniform diameter are dispersed. The anisotropic conductive film 4 is formed by being transferred from a support film onto the glass substrate 60. The lead terminals 1, ..., 1 of the glass substrate 60 and bumps 3, ..., 3 of the liquid crystal drive device 50 are connected, because the conductive particles 11a, ..., 11a in the anisotropic conductive film 4 are pressurized by a heating and pressing process. The liquid crystal drive device 50 is fixed to the glass substrate 60 by the anisotropic conductive film 4.

Thermosetting resin such as epoxy resin is used for the adhesive 12. A spherical particle, which has a plastic core with a nickel (Ni)-gold (Au) layer plated on the surface of the plastic core, may be used for the conductive particle 11.

The diameter of the conductive particles 11 arranged in the anisotropic conductive film 4 is smaller than the interval between the glass substrate 60 and the liquid crystal drive device 50. Thus, the liquid crystal drive device 50 is electrically insulated and separated from the glass substrate 60. Lead terminals of the glass substrate 60 and the bumps 3, ..., 3 of the liquid crystal drive device 50 is pressurized to connect the lead terminals and the bumps electrically.

Figure 6:
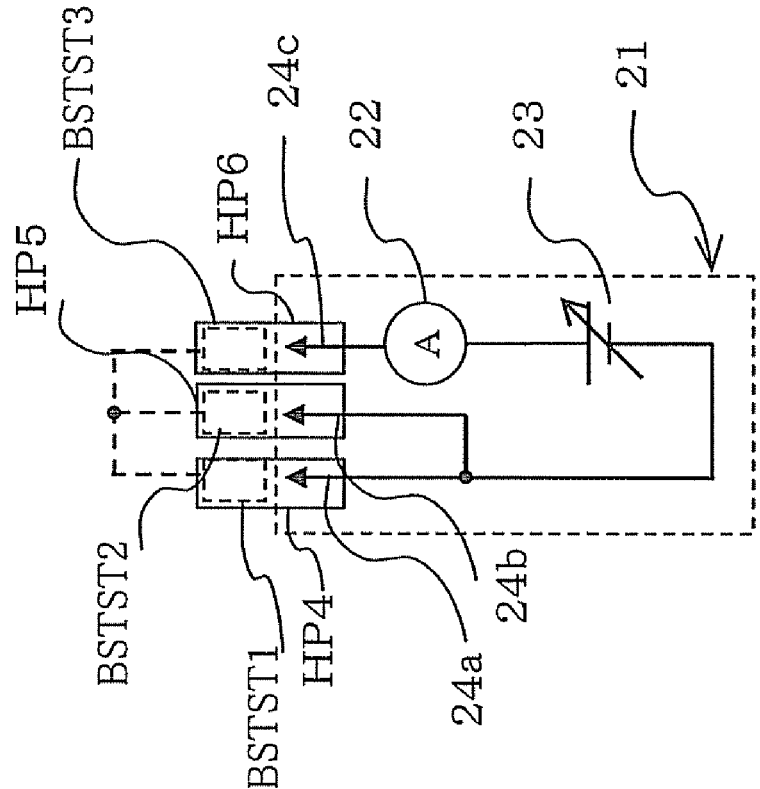
FIG. 6 is a schematic view showing an example of an apparatus for measuring the bump connection resistance of the liquid crystal drive device shown in FIG. 1.

FIG. 6 is a schematic view showing an example of an apparatus to measure the bump connection resistance of the liquid crystal drive device 50. As shown in FIG. 6, bump connection resistance, which is caused by using the terminals BSTST1 to BSTST3 shown in FIG. 3, is measured by an apparatus 21 to measure bump connection resistance. The apparatus 21 is provided with an ammeter 22, a DC power source 23, and measurement terminals 24a to 24c.

The measurement terminal 24a is made contact with an end portion of the wiring pattern HP4, which is connected to the terminal BSTST1 via one of the bumps. The measurement terminal 24b is made contact with an end portion of the wiring pattern HP5, which is connected to the terminal BSTST2 via another one of the bumps. The measurement terminal 24c is made contact with an end portion of the wiring pattern HP6, which is connected to the terminal BSTST3 via still another one of the bumps. As shown in FIG. 6, the measurement terminals 24a and 24b are made short-circuit each other. The ammeter 22 and power source 23 are cascade-connected to the measurement terminal 24c. When the voltage of the power source 23 is changed, it can be decided whether the bump connection resistance is a predetermined value or less.

Subsequently, similarly, the measurement terminal 24c, which is cascade-connected to the ammeter 22 and power source 23, are connected to another wiring pattern HP4 or HP5 to short the measurement terminal 24c and measurement terminal 24b or 24a, for example. In this way, bump connection resistance can be measured under a different bump connection.

These measurements are performed as a one-cycle measurement.

Figure 7:
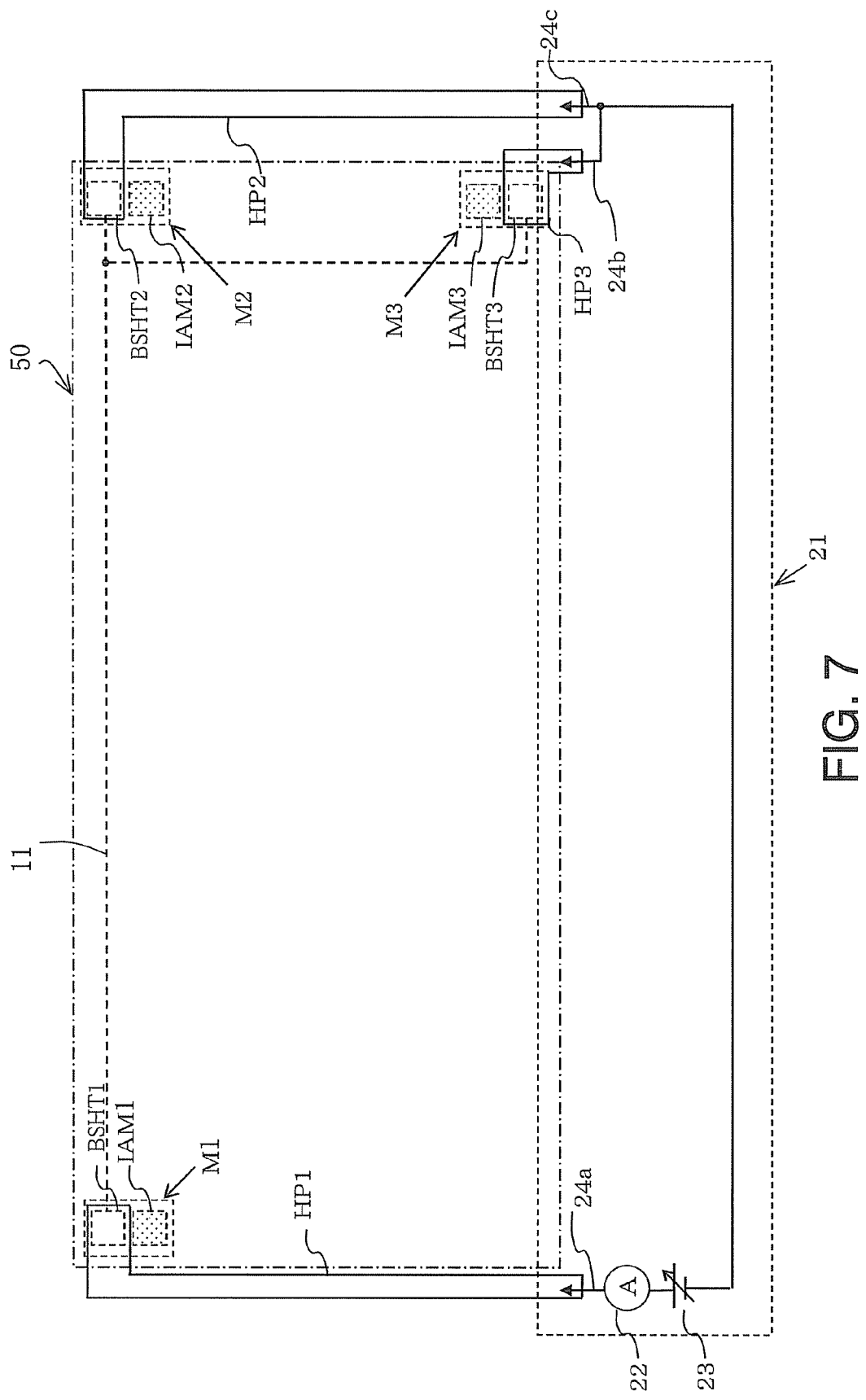
FIG. 7 shows a state where the apparatus for measuring bump connection resistance is connected to the liquid crystal drive device shown in FIG. 1.

As shown in FIG. 7, bump connection resistance measurement using the terminals BSHT1 to BSHT3 can be executed using the apparatus 21 to measure bump connection resistance.

The measurement terminal 24a is made contact with an end portion of the wiring pattern HP1, which is connected to the terminal BSHT1 via one of the bumps. The measurement terminal 24c is made contact with an end portion of the wiring pattern HP2, which is connected to the terminal BSHT2 via another one of the bumps. The measurement terminal 24b is made contact with an end portion of the wiring pattern HP3, which is connected to the terminal BSHT3 via further another one of the bumps. The measurement terminals 24b and 24c are made short-circuit each other. The ammeter 22 and power source 23 are cascade-connected to the measurement terminal 24a. When the voltage of the power source 23 is changed, it can be decided whether the bump connection resistance is a predetermined value or less in the three corner regions of the liquid crystal drive device 50.

Subsequently, similarly, the measurement terminal 24a is connected to the wiring pattern HP2, and the remaining measurement terminals 24b, 24c are connected to the wiring patterns HP1, HP3 other than the wiring pattern HP2, for example. In this way, bump connection resistance can be measured under a different bump connection.

These measurements are performed as a one-cycle measurement.

In the embodiment, the terminals BSHT1 to BSHT3 serve as positioning marks and terminals to measure bump connection resistance. The terminals BSHT1 to BSHT3 are connected to the common connection wire 11 in the chip. As a result, the number of terminals to measure bump connection resistance on the chip can be decreased. The chip area of the liquid crystal drive device 50 can be reduced.

Figure 2:
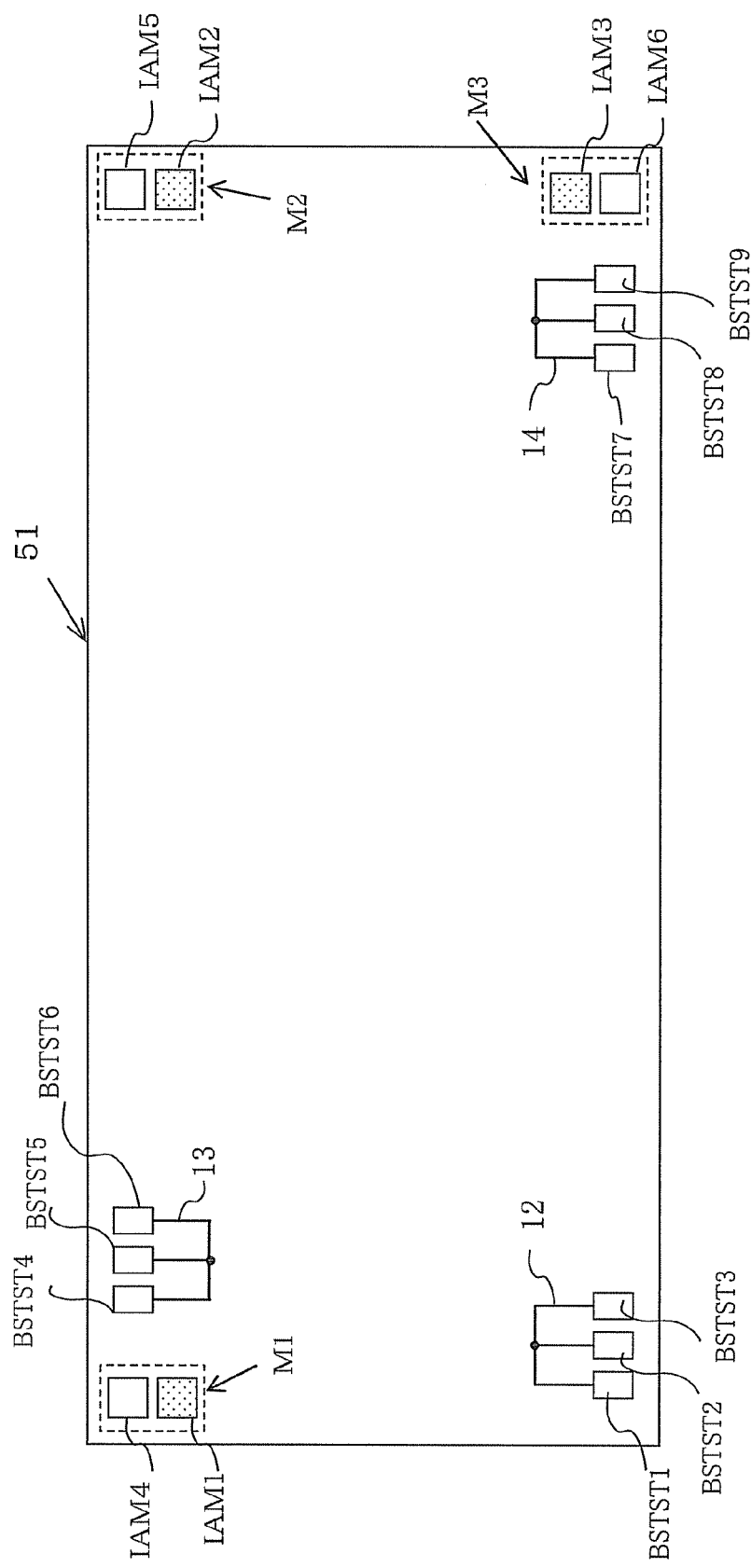
FIG. 2 is a plan view showing a liquid crystal drive device as a comparison example.

FIG. 2 shows a liquid crystal drive device 51 as a comparison example. The liquid crystal drive device 51 is constituted by a chip. In the chip, positioning marks IAM4 to IAM6, which are adjacent to the positioning marks IAM1 to IAM3, are provided in positioning mark regions M1 to M3. The positioning marks IAM1 to IAM3 are formed of the same metal layer as that of the chip wire. Metal bumps are provided on the positioning marks IAM4 to IAM6 respectively. Terminals BSTST4 to BSTST9 are provided separately from the positioning marks IAM4, IAM6 on the chip.

In order to measure bump connection resistance of a plurality of corner regions of the chip, a group of the terminals BSTST4 to BSTST6 is arranged in an upper left corner region of the chip, and a group of the terminals BSTST7 to BSTST9e is arranged in the lower right corner region of the chip.

The terminals BSTST4 to BSTST6 are arranged away from each other near the positioning mark region M1, and are commonly connected to connection wires 13. The terminals BSTST7 to BSTST9 are arranged away from each other near the positioning mark region M3, and are commonly connected to connection wires 14. Using the terminals BSTST4 to BSTST6 or the terminals BSTST7 to BSTST9, the bump connection resistance can be measured using an apparatus 21 to measure bump connection resistance. However, the number of terminals, which are formed on the chip to measure bump connection resistance, is increased. Therefore, the chip area of the liquid crystal drive device 51 is increased.

In the comparison example, bump connection resistance is measured by performing three cycles of measurement. On the other hand, in the embodiment, bump connection resistance can be measured by performing two cycles of measurement. Therefore, according to the embodiment, the number of measurement times can be reduced.

In the embodiment, the chip is mounted on the glass substrate using the anisotropic conductive film 4 to obtain a COG. The COG may be fabricated by heating and pressurizing a gold (Au) bump or processing a gold (Au) bump with ultrasonic waves, so as to fix the liquid crystal drive device to the glass substrate, and then by sealing the first main surface of the liquid crystal drive device using an underfill resin material. In the embodiment, the semiconductor device is formed by a COG technique to mount the liquid crystal drive device on the glass substrate using bumps. The semiconductor device may be formed by a COF technique to mount a semiconductor integrated circuit chip on a tape substrate using bumps, or by a technique to mount a semiconductor integrated circuit on a ceramic substrate using bumps.

A second embodiment of the invention will be described with reference to FIGS. 8 and 9.

Figure 8:
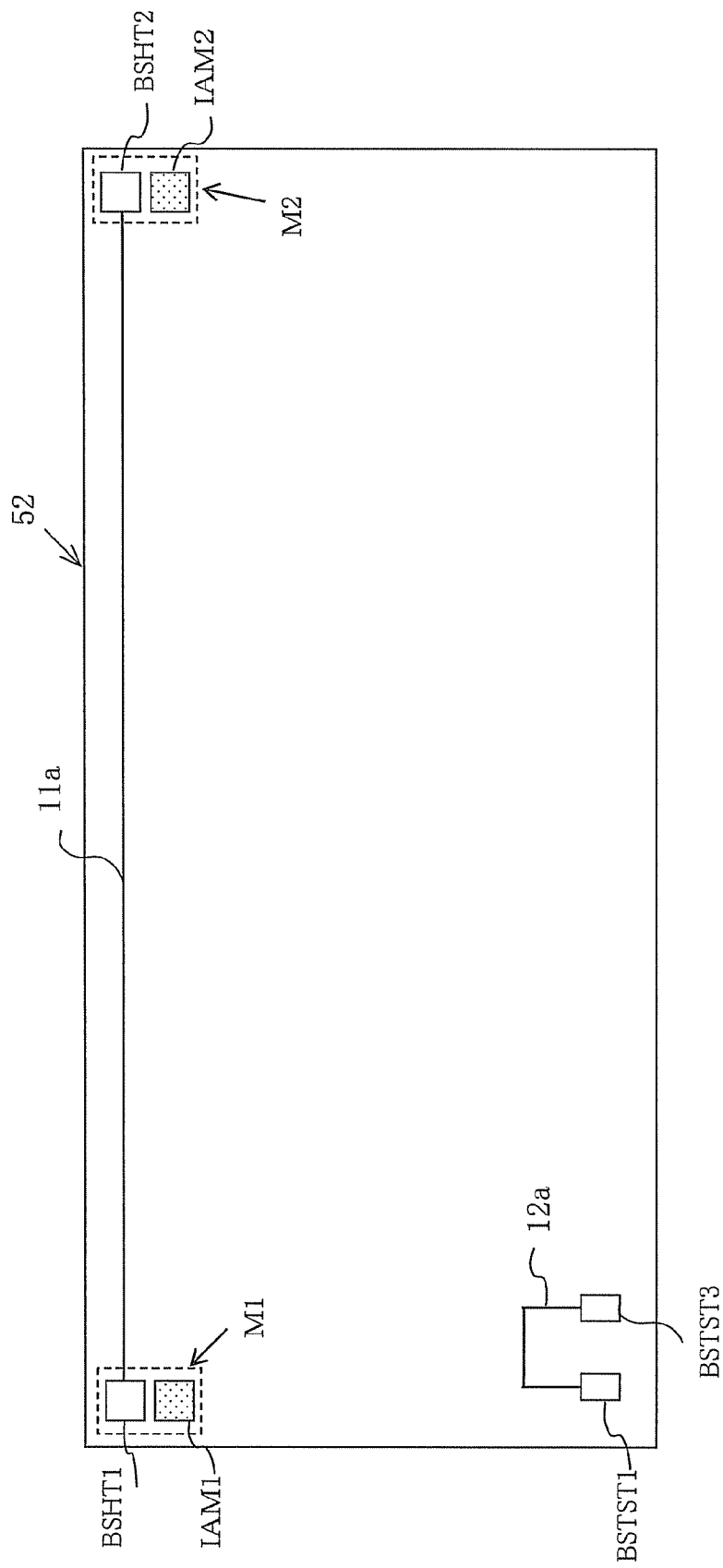
FIG. 8 is a plan view showing a liquid crystal drive device of a second embodiment of the invention.

FIG. 8 is a plan view showing the liquid crystal drive device of the second embodiment. As shown in FIG. 8, terminals BSHT1, BSHT2 to measure bump connection resistance, positioning marks IAM1, IAM2, and terminals BSTST1, BSTST3 are provided on a liquid crystal drive device 52 as a semiconductor integrated circuit, similarly to the first embodiment shown in FIG. 1. The terminals BSHT1, BSHT2 are connected by a connection wire 11a in a chip including the liquid crystal drive device 52. The terminals BSTST1, BSTST3 are commonly connected to a connection wire 12a in the chip.

The terminal BSHT1 and positioning mark IAM1 are formed in a positioning mark region M1. The terminal BSHT2 and positioning mark IAM2 are formed in a positioning mark region M2.

Chip terminals are formed at intervals on the chip. On the chip terminals, similarly to the first embodiment, bumps are laminated respectively. The terminals BSHT1, BSHT2, BSTST1 and BSTST3 are respectively ones of the chip terminals. Bumps are respectively laminated on the terminals BSHT1, BSHT2, BSTST1 and BSTST3.

In FIG. 8, chip terminals between the terminals BSHT1 and BSHT2 are not shown. The positioning marks IAM1 to IAM2 are formed of the same metal layer as that of the wire of the chip.

In the embodiment, the terminal BSHT3, the positioning mark IAM3 and the positioning mark region M3, where the terminal BSHT3 and positioning mark IAM3 are formed as described in the first embodiment shown in FIG. 1, do not exist. Further, in the embodiment, the terminal BSTST2 described in the first embodiment shown in FIG. 1 does not exist.

Figure 9:
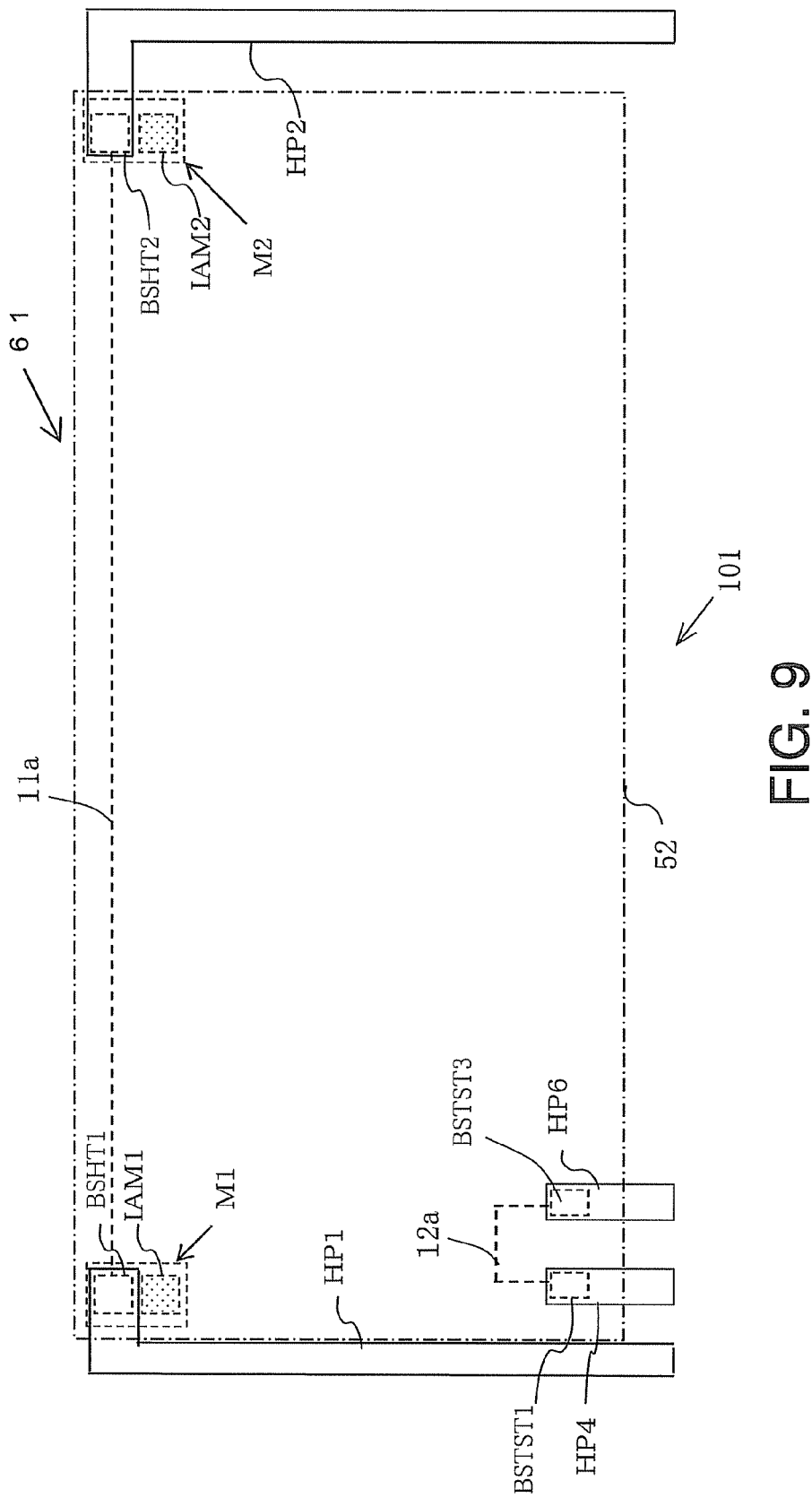
FIG. 9 is a plan view showing a semiconductor device where the liquid crystal drive device shown in FIG. 7 is mounted on a glass substrate.

FIG. 9 is a plan view showing a semiconductor device 101 where the liquid crystal drive device 52 shown in FIG. 8 is mounted on a glass substrate 61.

The liquid crystal drive device 52 is mounted on the glass substrate 61 using an anisotropic conductive film (ACF) by a chip on glass method.

As shown in FIG. 9, wiring patterns HP1, HP2, HP4, and HP6 are provided apart from each other on a first main surface of the glass substrate 61. The glass substrate 61 is provided to mount a liquid crystal drive device 52. In FIG. 3, the glass substrate 60 is positioned upward in a direction vertical to the paper of the drawing. The wiring patterns HP1, HP2, HP4, and HP6 positioned downward in the vertical direction are shown in solid lines.

The wiring patterns HP1, HP2, HP4, and HP6 are formed similarly to the first embodiment.

The glass substrate 61 constitutes the liquid crystal drive device 52. The liquid crystal drive device 52 is face-downed and mounted on a mounting region of the glass substrate 61 of the liquid crystal drive device 52.

According to the embodiment, the number of the terminals to measure bump connection resistance can be decreased from that of the first embodiment. Therefore, the chip area composing the liquid crystal drive device 52 can be reduced.

According to the embodiment, the number of measuring times of bump connection resistance can be reduced from that of the first embodiment.

In the embodiment, the terminals BSTST1, BSTST3 are provided in a lower left corner region of the liquid crystal drive device 52. Instead, the terminals BSTST1 to BSTST3 may be provided in the lower left corner region and be connected with the connection wire 12a, as the first embodiment.

A third embodiment of the invention will be described with reference to FIGS. 10 to 12.

Figure 10:
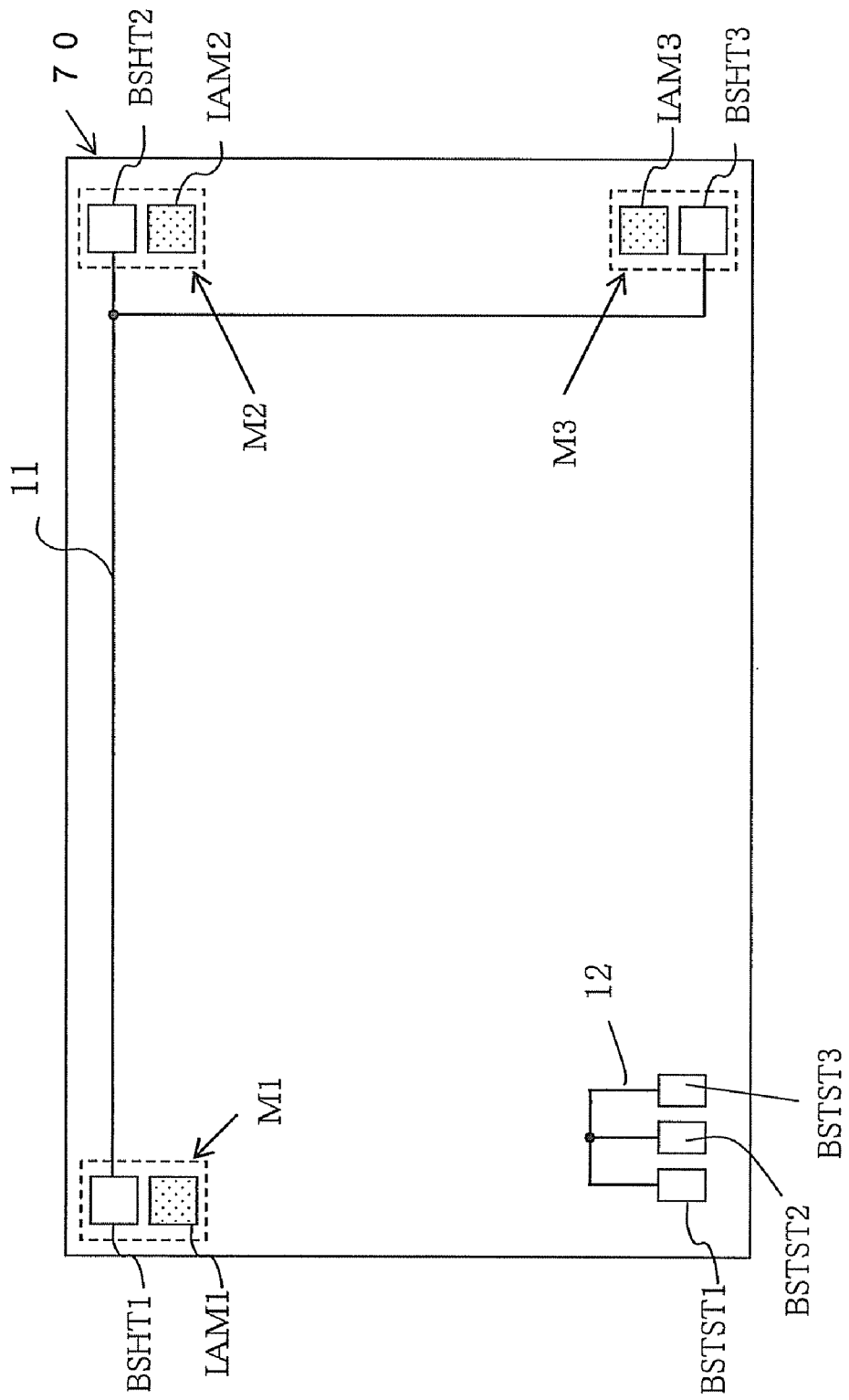
FIG. 10 is a plan view showing a logic LSI of a third embodiment of the invention.

FIG. 10 is a plan view showing a logic LSI of the third embodiment. FIG. 11 is a cross sectional view showing a semiconductor device where the logic LSI is mounted on a memory chip via bumps. FIG. 12 shows a section taken along a plane B-B of the semiconductor device shown in FIG. 11.

In FIG. 10, positioning mark regions M1 to M3 are provided on a chip composing a logic LSI 70, similarly to FIG. 1. Terminals BSHT1 to BSHT3 and positioning marks IAM1 to IAM3 are respectively formed in the positioning mark regions M1 to M3. Furthermore, terminals BSTST1 to BSTST3 are formed on the chip composing the logic LSI 70, similarly to FIG. 1. The terminals BSHT1 to BSHT3 are provided to measure bump connection resistance, and are connected to each other with a connection wire 11 in the chip. The terminals BSTST1 to BSTST3 are connected to each other with the connection wires 12 in the chip, similarly to FIG. 1.

The width of the chip in the lateral direction of the drawing is narrower than that of the chip of the first embodiment.

A plurality of logic circuits, a sequence circuit, an input-output circuit and so forth (respectively not shown) are provided on a first main surface of the chip composing the logic LSI 70. Chip terminals are provided at narrow intervals on the chip. Minute bumps are respectively laminated at narrow intervals on the chip terminals. The terminals BSHT1 to BSHT3 and BSTST1 to BSTST3 are respectively ones of the chip terminals. The bumps, which will be described in detail later, are respectively laminated on the chip terminals including the terminals BSHT1 to BSHT3 and BSTST1 to BSTST3.

In the embodiment, in place of the gold (Au) bumps used in the first embodiment, solder bumps may be used.

Figure 11:
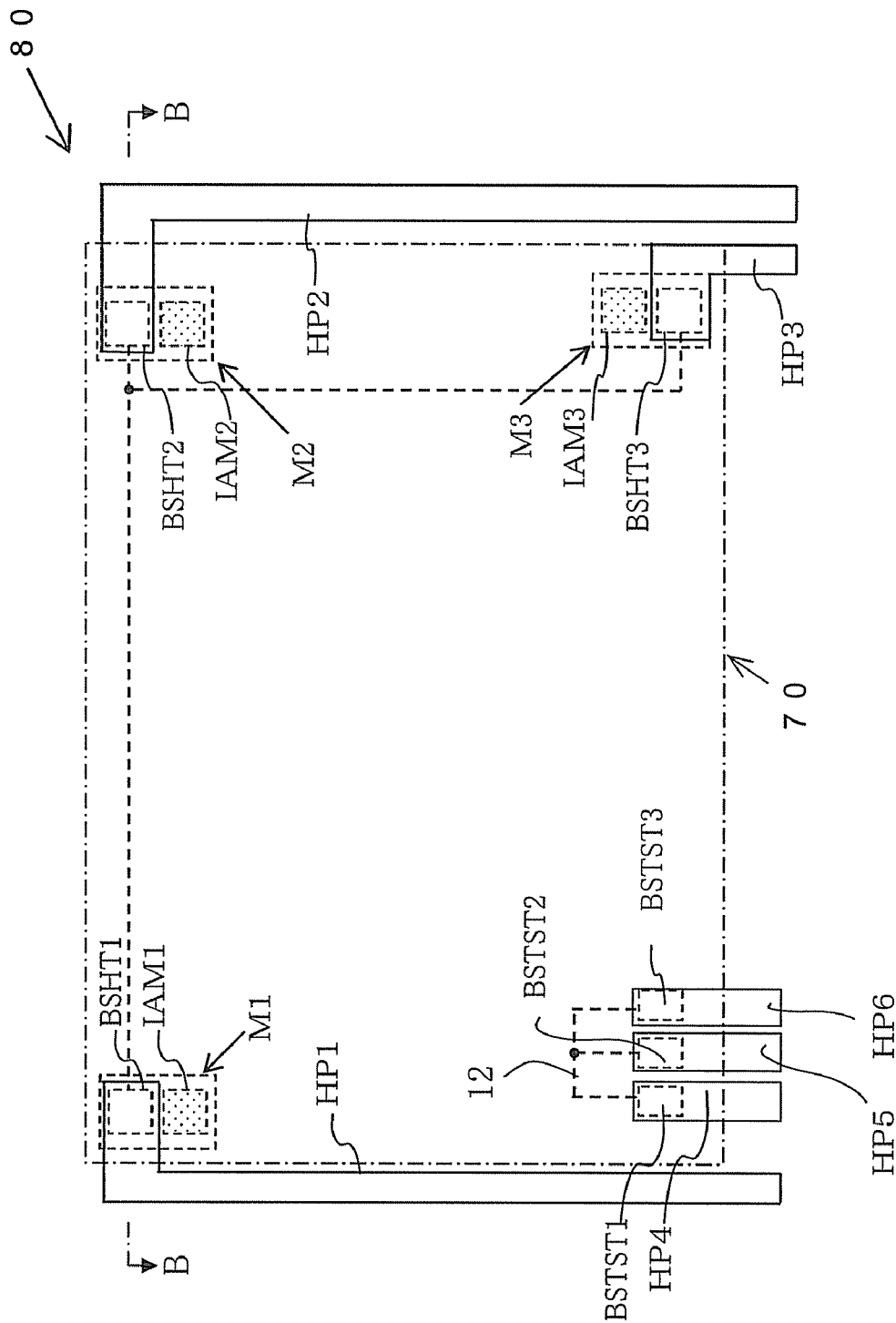
FIG. 11 is a plan view showing a semiconductor device where the logic LSI shown in FIG. 10 is mounted on a memory chip.

As shown in FIG. 11, wiring patterns HP1 to HP6 are arranged apart from each other on a first main surface of the chip (semiconductor substrate) including a memory 80 as a semiconductor integrated circuit. In FIG. 11, the chip including the memory 80 is positioned upward in a direction vertical to the paper of the drawing. The wiring patterns HP1 to HP6 positioned downward in the vertical direction are shown in solid lines.

A plurality of memory blocks and an input-output circuit (respectively not shown) are provided on the first main surface of the chip of the memory 80. The chip terminals of the logic LSI 70 and the chip terminals connected via the bumps are provided on the chip composing the memory 80.

The chip of the memory 80 is larger than that of the logic LSI. The logic LSI 70 is face-downed and mounted on the first main surface of the chip composing the memory 80. The wiring patterns HP1 to HP6 are ones of the chip terminals of the memory 80 respectively. In FIG. 11, the wiring patterns HP1 to HP6 are arranged in the similar positions to those of the first embodiment shown in FIG. 3.

The semiconductor device, in which the logic LSI is mounted, will be described with reference to FIG. 12. FIG. 12 is a cross sectional view showing the semiconductor device to mount the logic LSI on the memory chip.

Figure 12:
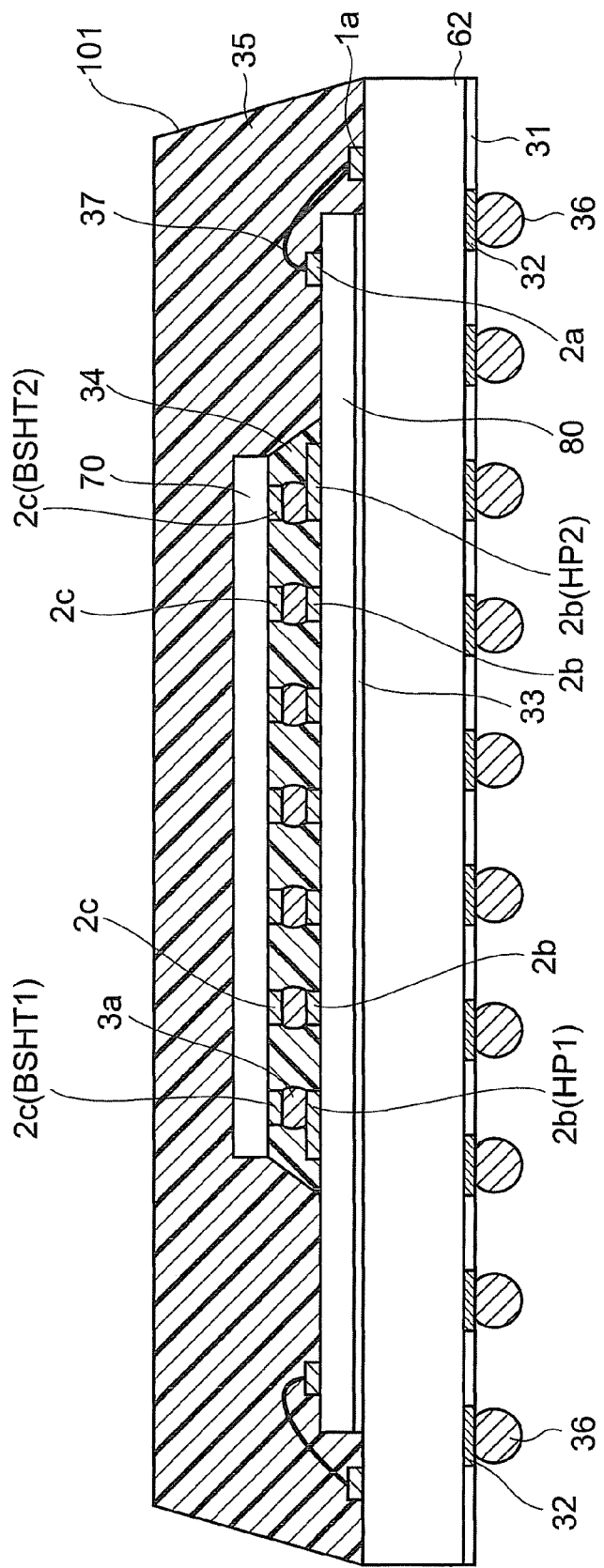
FIG. 12 is a view of a section of the semiconductor device shown in FIG. 11.

As shown in FIG. 12, the semiconductor device 101 is a device, in which the logic LSI is mounted on the memory 80 using solder bumps by a chip on chip method.

A plurality of lead terminals 1a, . . . , 1a is provided at an end portion of a first main surface of an insulating substrate 62. The memory 80 is mounted via a film 33 at a central portion of the first main surface of the insulating substrate 62. The memory 80 is fixed to the insulating substrate 62 by an adhesive (not shown) which is formed on both sides of the film 33.

A plurality of connection terminals 32, . . . , 32, which is electrically separated from each other, are provided on a second main surface (rear) opposite to the first main surface of the insulating substrate 62. Ball terminal 36, ..., 36 are provided on surfaces of a lower side of the connection terminals 32, ..., 32 respectively. The ball terminals 36, ..., 36 are electrically connected to the connection terminals 1a, ..., 1a by wires passing through the insulating substrate 62.

The chip terminals 2a, ..., 2a are provided at an end portion of the first main surface of the memory 80,. The chip terminals 2a, ..., 2a and lead terminals 1a, ..., 1a are electrically connected via bonding wires 37. The chip terminals 2b, ..., 2b are provided at narrow pitch intervals on a central portion of the first main surface of the memory 80. Some of the chip terminals 2b, ..., 2b are the wiring patterns HP1 to HP6 shown in FIG. 11.

The chip terminals 2c, ..., 2c are provided at narrow pitch intervals on the first main surface of the logic LSI 70. The logic LSI 70 is face-downed and mounted so that the first main surface may face the first main surface of the memory 80. The chip terminals 2b, ..., 2b of the memory 80 and the chip terminals. 2c, ..., 2c of the logic LSI 70 are respectively connected electrically with the bumps 3a, ..., 3a. Some of the chip terminals 2c, ..., 2c are the terminals BSHT1 to BSHT3 and BSTST1 to BSTST3 which are shown in FIGS. 10 and 11.

An underfill resin material 34 is filled up between the memory 80 and the logic LSI 70, and seals an air gap between the memory 80 and the logic LSI 70. The first main surface of the insulating substrate 62, the memory 80, the logic LSI 70, and the underfill resin material 34 are sealed by an insulating sealing material 35. Epoxy resin may be used for the underfill resin material 34 and the sealing material 35.

In the embodiment, the solder bumps 3a, ..., 3a are formed on the chip terminals 2c, ..., 2c of the logic LSI 70 and then the chip terminals 2b, ..., 2b of the memory 80 and the chip terminals 2c, ..., 2c of the logic LSI 70 are connected via the bumps 3a, ..., 3c. First solder bumps may be formed on the chip terminals 2c, ..., 2c of the logic LSI 70, and second solder bumps may be formed on the chip terminals of the memory 80. Further, the first and second bumps may be connected, and the chip terminals 2b, ..., 2b of the memory 80 and the chip terminals 2c, ..., 2c of the logic LSI 70 may be connected via the first and second solder bumps. In this case, the size of the first and second solder bumps can be made smaller than the solder bumps 3a, ..., 3b to increase bump mounting density.

According to the embodiment, the bump connection resistance of the solder bumps 3a, ..., 3a, which connect the chip terminals 2b, ..., 2b of the memory 80 and the chip terminals 2c, ..., 2c of the logic LSI 70, can be measured using the apparatus 21 shown in FIG. 6 to measure connection resistance. The measurement is executed by allowing the terminals BSHT1 to BSHT3 and BSTST1 to BSTST3 to make contact with the measurement terminals 24a to 24c of the apparatus 21 shown in FIG. 6, similarly to the first embodiment.

In the embodiment, the terminals BSHT1 to BSHT3, which are dispersed and connected commonly, are used. Thus, the number of terminals of the logic LSI is decreased, and the number of measuring times can be reduced. In the embodiment, even when the size of the bumps 3a, ..., 3a are minimized, the intervals of the solder bumps are narrowed, and the numbers of the chip terminals 2b, ..., 2b of the memory 80 and the chip terminals 2c, ..., 2c of the logic LSI are increased greatly, it can be judged quickly whether the bump connection resistance of the solder bumps 3a, ..., 3a is less than a predetermined value or not.

Furthermore, in the embodiment, the chip areas of the logic LSI and memory 80 can be reduced.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor integrated circuit comprising:
   a chip in which an integrated circuit is formed;
   positioning marks provided on at least two of four regions respectively near four corners of a first main surface of the chip;
   terminals to measure bump connection resistance, the terminals being provided on the first main surface so as to adjoin the positioning marks respectively; and
   a connection wire provided in the chip, the connection wire connecting the terminals electrically.

2. A semiconductor integrated circuit according to claim 1, wherein the positioning marks and the terminals to measure bump connection resistance are provided in three of the four regions of the first main surface respectively.

3. A semiconductor integrated circuit according to claim 1, further comprising bumps provided on the terminals to measure bump connection resistance respectively.

4. A semiconductor integrated circuit according to claim 3, wherein the terminals to measure bump connection resistance are capable of being used as positioning marks.

5. A semiconductor integrated circuit according to claim 1, wherein ends of the connection wire are respectively connected to lower portions of the terminals to measure bump connection resistance.

6. A semiconductor integrated circuit according to claim 1, wherein a positioning mark is not provided on one of the four regions of the first main surface, and the number of the terminals is at least two, and wherein the connection wire is provided in the chip to connect the terminals.

7. A semiconductor integrated circuit according to claim 6, further comprising bumps provided on the terminals to measure bump connection resistance respectively.

8. A semiconductor integrated circuit according to claim 6, wherein the terminals are capable of being used as positioning marks.

9. A semiconductor integrated circuit according to claim 1, wherein the integrated circuit is a data line drive circuit for driving a liquid crystal panel.

10. A semiconductor integrated circuit according to claim 1, wherein the integrated circuit is a logic LSI.

11. A semiconductor device comprising:
    a substrate;
    at least two wiring patterns formed apart from each other on a first main surface on the substrate;
    a chip in which an integrated circuit is formed;
    positioning marks provided on at least two of four regions respectively near four corners of a first main surface of the chip;
    terminals to measure bump connection resistance, the terminals being provided on the first main surface so as to adjoin the positioning marks respectively;
    a connection wire provided in the chip, the connection wire connecting the terminals commonly; and
    bumps provided between the terminals and the wiring patterns to connect the terminals and the wiring patterns respectively electrically.

12. A semiconductor device according to claim 11, wherein the positioning marks, the terminals to measure bump connection resistance, the bumps, and ends of the wiring patterns are provided in three of the regions of the first main surface respectively.

13. A semiconductor device according to claim 11, wherein ends of the connection wire are connected to lower portions of the terminals respectively.

14. A semiconductor device according to claim 11, wherein a positioning marks are not provided in one of the four regions of the first main surface, and the number of the terminals is at least two, and wherein a connection wire is provided in the chip to connect the terminals.

15. A semiconductor device according to claim 11, wherein the integrated circuit formed in the chip is a data line drive circuit for driving a liquid crystal panel.

16. A semiconductor device according to claim 11, wherein the integrated circuit formed in the chip is a logic LSI, and the substrate is a chip in which an integrated circuit is formed.

17. A semiconductor device according to claim 11, wherein the substrate is an integrated circuit chip constituting a memory.

18. A semiconductor device according to claim 11, wherein the wiring patterns are capable of being made contact with measurement terminals of an apparatus to measure bump connection resistance.

* * * * *